Nov. 12, 1963 R. A. RAMEY, JR., ETAL 3,110,628

THERMOELECTRIC ASSEMBLY

Filed March 2, 1960

INVENTORS
Robert A. Ramey, Jr.
& Thomas M. Corry
BY E. H. Liss
ATTORNEY

United States Patent Office 3,110,628
Patented Nov. 12, 1963

3,110,628
THERMOELECTRIC ASSEMBLY

Robert A. Ramey, Jr., Pitcairn, and Thomas M. Corry, Monroeville, Pa., assignors to Westinghouse Electric Corporation, East Pittsburgh, Pa., a corporation of Pennsylvania Filed Mar. 2, 1960, Ser. No. 12,427
5 Claims. (Cl. 136—4)

The present invention relates to thermoelectric devices, and more particularly, to a modular thermoelectric assembly which utilizes a flexible structure to prevent failure of the assembly due to shrinkage and expansion during heating cycles.

When a circuit is formed of two metals of different materials, one of the junctions being at a higher temperature than the other, an electro-motive force is produced in the circuit. This thermoelectric effect is known as the Seebeck effect. Besides the Seebeck effect, there are two other thermoelectric effects: the Peltier effect and the Thompson effect.

The Peltier effect is the inverse of the Seebeck effect. When two dissimilar metals are connected in series with a source of electro-motive force which establishes current in the circuit, one junction will become heated and the other cooled. This effect is distinct from the heating of both metals by the current due to their resistance.

An analysis of the foregoing effects resulted in the Thompson effect. This effect deals with a uniform metal bar. When different parts of the same metal are at different temperatures, electro-motive force exists between the different parts.

Thermocouples utilizing these effects have been used for a long time but recently with the advance of the modern science of semiconductors, practical application of thermoelectricity and high power applications thereof have become of more importance. Early thermocouples proved to be quite inefficient. The prospects of obtaining an appreciable efficiency in thermoelectric generators, refrigerators and heating devices with the advent of semiconductors has improved considerably.

Thermoelectric devices for use in power applications such as generators, refrigerators or heating devices, consist essentially of a plurality of thermoelectric elements in which precisely machined elements are assembled into a rigid ladder of series or series-parallel connected elements. The ladder is pressed between a heat source and a heat sink.

Presently available thermoelectric materials used in the assembly of thermoelectric generators have low yield strength in shear and tensile stress. To operate efficiently, these materials must maintain good thermal contact between the hot and cold side of the heat exchanger structure. Due to the high operating temperatures and the large temperature difference between the heat source and heat sink, it is difficult to build a rigid heat exchanger structure that will maintain good thermal contact with the thermal elements without creating excessive shear and tensile stresses in the material and thereby causing failure of the generator. In a rigid ladder assembly of the known type it can be seen that uneven shrinkage or expansion of the assembly and surface imperfections on the walls of the heat source and heat sink will cause poor thermal contact to exist along portions of the thermocouple ladder. Thermoelectric devices for high power applications usually consist of many elements connected in series or of parallel groups connected in series. Therefore, a flexible linkage is required between the elements of the assembly and the heat exchanger to connect, for example, one hundred or more elements in series to produce an assembly which will produce the desired voltage in order to avoid damage by stresses.

The voltage and current output of the generator depends to a large extent on the number of the thermoelectric elements employed. Therefore, it is desirable to utilize a modular structure in order to obtain the desired voltage and current. With the presently known rigid ladder structure, this requires a preselected size heat exchanger for each of the various output voltages and currents required. Such an arrangement results in complex and uneconomical manufacturing techniques. A modular assembly permits manufacturing and stocking of identical thermal radiators adapted to be assembled into a unitary thermoelectric device of the size desired.

As pointed out hereinabove, it is desirable that the thermoelectric assembly be flexible to permit shrinkage and expansion of the heat exchanger parts in order to avoid failure of the thermoelectric elements. While it is desirable to have a flexible linkage between the exchanger and the thermoelectric elements, it is also essential that the thermoelectric element be in close thermal contact with heat exchanger in order to minimize thermal drop between the thermal radiator and the thermoelectric element. This is particularly important at the hot junction. The two requisites—flexibility and close thermal contact—raise a series problem in that the requirements are inconsistent with each other. These seemingly inconsistent requirements are solved by applicants' novel modular construction.

The present invention discloses a modular thermal radiator having at least one pair of thermoelectric elements bonded directly to the hot thermal radiator. At the end remote from the hot thermal radiator, the thermoelecric elements have a flexible lead which is secured to a thermal radiator on the cold side. The hot and cold thermal radiators are of identical construction. As many of these thermoelectric assemblies as is desired can be arranged in side by side relation to form a thermoelectric device which may be a generator, a refrigerator or a heating device. Compressible biasing means for extending the flexible cable are disposed intermediate the thermoelectric elements and the heat sink or cold thermal radiator. This structure permits excellent thermal contact with the heat exchanger despite structural shrinking or expansion or loose tolerances in the machining and assembly of the thermal elements. It also permits much greater flexibility in generator design in that thermoelectric element efficiency can be more easily optimized because the length of the two thermoelectric elements and the generator subassembly need not be nearly equal.

The principal object of the invention is to provide a flexible thermoelectric assembly of modular design which results in economical construction.

Another object of the invention is to provide a modular thermoelectric device which eliminates failure due to shrinkage and to expansion and which minimizes heat loss at the hot junction thereby permitting greater flexibility in design and resulting in economical construction.

A further and more specific object of the invention is to provide a modular thermoelectric assembly in which the thermoelements are bonded to one thermal radiator and flexibly secured to the other to provide a thermoelectric device in which as many modules as desired can be utilized to provide an economical and efficient thermoelectric device of a desired size.

Other objects and advantages of the invention will be apparent from the following detailed description taken in connection with the accompanying drawings, in which.

Figure 1:
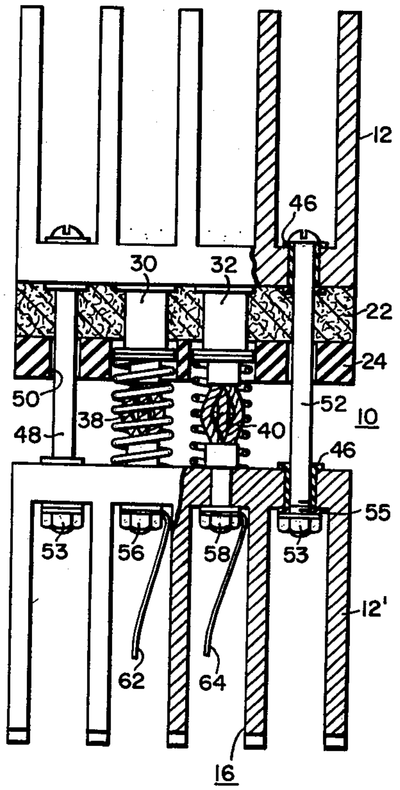
FIGURE 1 is an end elevational view of the thermoelectric device embodying the invention.

In the drawings there is shown a thermoelectric device 10 which comprises a plurality of modular thermal radiators 12 secured together to form a heat source 14 and a second group of modular thermal radiators 12′ to form a heat sink 16. Disposed intermediate the heat source 14 and heat sink 16 are a plurality of thermoelectric elements 18 and 20. The material employed in the thermoelectric element 18 is dissimilar from the thermoelectric material employed in the thermoelectric element 20. If desired, insulating batting 22 may be disposed about the thermoelectric elements 18 and 20 adjacent the heat sink. This batting may be of any suitable insulating material, as for example, fiber glass. A second layer of insulating board 24 may be provided and which extends for the entire area of the heat source 14. Although these layers of insulation 22 and 24 are not essential for satisfactory operation of the thermoelectric device, vastly improved results are obtained by their use. The insulating batting prevents heat transfer from the heat source 14 to the heat sink 16 as does the insulating board 24. Thus, a greater temperature difference can be maintained. In addition, the insulating board 24 provides a more solid construction.

Figure 3:
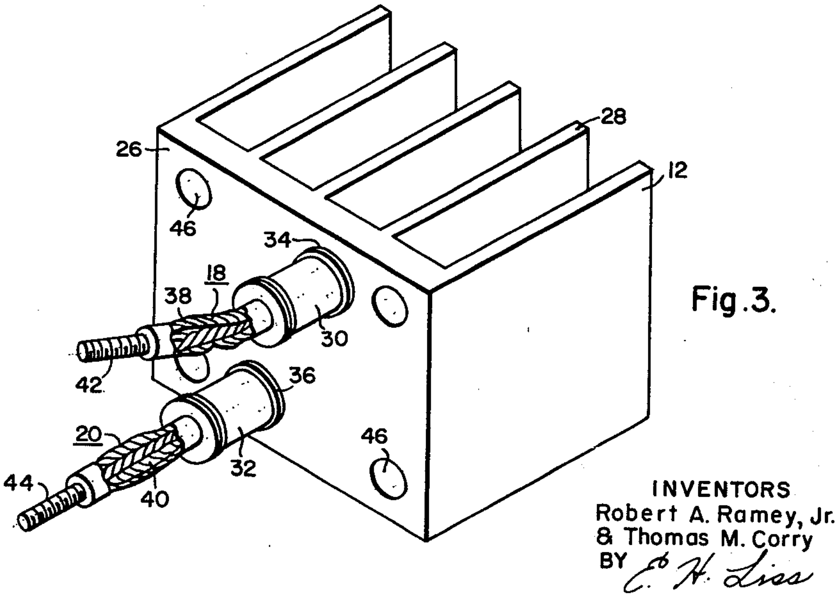
FIG. 3 is a perspective view of one module of the invention showing the thermal radiator constituting the heat source.

The construction of the module can be seen more clearly in FIG. 3. This figure illustrates a module 12 which forms a portion of the heat source 14. The module 12 comprises a rectangular base 26 having a plurality of fins 28 extending perpendicular to its surface. Secured to the base at its surface remote from the fins are bonded the thermoelectric elements 18 and 20. Each of the elements 18 and 20 comprise a body of semiconductor material 30 and 32, respectively. The semiconductor material employed is a particular composition which is useful in thermoelectric applications. The thermoelectric semiconductor material in the body 30 of the thermoelectric element 18 is of p-type semiconductor material and the semiconductor material of the body 32 of thermoelectric element 20 is n-type semiconductor material. The bodies of thermoelectric material 30 and 32 are shown as being cylindrical but it will be understood that they may be of any suitable or desirable shape in cross section such as square or polygonal, for example. The ends of the bodies 30 and 32 are bonded to the base 26 of the thermal radiator or module 12 as at 34 and 36. Secured to the ends of the bodies of thermoelectric material 30 and 32 are braided conducting cables 38 and 40, respectively. Any suitable conducting material may be used for cables 38 and 40, such as, for example, copper. Threaded studs 42 and 44 are secured to the ends of the cables 38 and 40, respectively. A plurality of openings 46 extend through the base 26 of the modular unit 12 for a purpose to be hereinafter explained.

The module 12′ which can best be seen in FIG. 1 is identical in structure with the module 12. However, the thermoelectric elements are not bonded to the modules 12′. The modules 12′ are adapted to be arranged to provide a heat sink 16.

Figure 2:
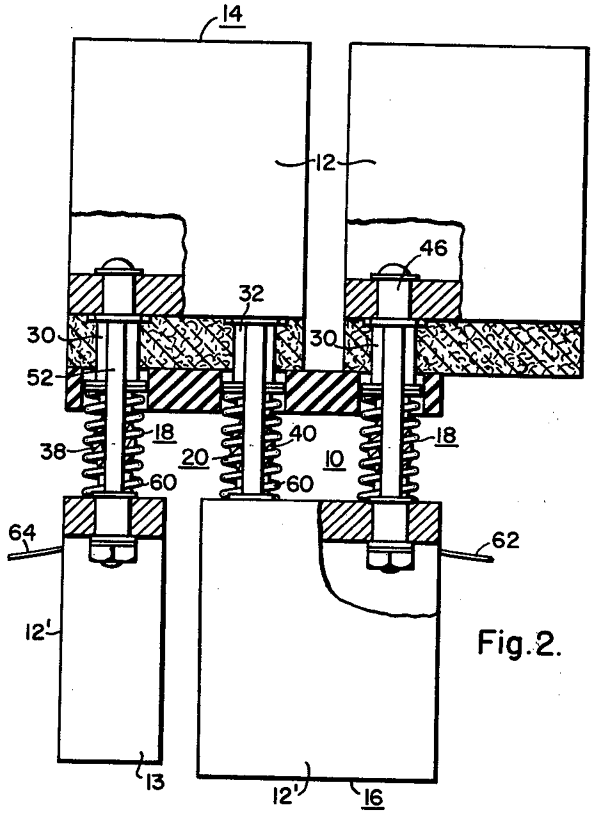
FIG. 2 is a side elevational view similar to FIG. 1.

The arrangement of the modules 12 and 12′ to form a heat exchanger is best seen in FIGS. 1 and 2. The modular thermoelectric elements 12 of heat source 14 are arranged in alignment with each other in a plurality of columns; the columns are in alignment with each other. This array of thermal radiators forms an extended heat source. As many thermal radiators 12 as are desirable may be employed to form the heat source. The heat sink 16 is formed by an array of thermal radiators 12′ in which the modular radiators 12′ are arranged in a plurality of longitudinally aligned columns. The columns are arranged in transverse alignment. The columns of thermal radiators in both the heat source 14 and the heat sink 16 have their fins in longitudinal alignment to provide for proper air flow. The heat source 14 and the heat sink 16 are disposed relative to each other with their bases in opposition and their fins extending in opposite directions. All of the thermal radiators are electrically insulated from each other. As shown in the drawings, they are separated by air space but electrical insulation may be provided in the interstices between the modular thermal radiators if desired.

The thermoelectric elements 18 and 20 are disposed on opposite sides of a center line parallel to the plane of the base. The modular radiators 12′ are offset with respect to the modular radiators 12 in a direction perpendicular to the center line between the thermoelectric elements 18 and 20. This offset relationship can best be seen in FIG. 2. They are offset approximately one half the width of a modular element, measuring the width in the direction in which they are offset. Thus, it can be seen from FIG. 2 that a projection of a thermal radiator 12′ on the thermal radiator 12 will extend from the center of one thermal radiator 12 to the center of the next adjacent thermal radiator 12. In order to provide a neat rectangular heat source 14 which is co-extensive with the heat sink 16 it is desirable to provide a modular element 13 at the end of each column of modular thermal radiators 12′ which is approximately one half the width of the modular elements 12 and 12′. This can clearly be seen in FIG. 2.

The thermal insulating board 24 co-extensive with the heat sink 14 and 16 is disposed intermediate the heat sink 16 and the heat source 14. Intermediate the insulating board 24 and the heat source 14 are disposed a plurality of insulating bats 22. Openings 48 and 50 are provided in insulating bats 22 and insulating board 24, respectively. Corresponding openings 46 in thermal radiators 12 and 12′ and openings 48 and 50 in insulating bats 22 and insulating board 24 respectively are arranged in alignment to receive bolts 52. Bolts 52 are secured by nuts 53 at their threaded ends 55. Bolts 52 are electrically insulated and, preferably, thermally insulated to prevent a thermal or electrical shunt between the heat source 14 and the heat sink 16. The bolts 52 maintain the thermal radiators 12 and 12′ and the insulating bats 22 and insulating board 24 in position to provide a stable construction. Openings 54 are provided in thermal radiators 12′ in alignment with the thermoelectric elements 18 and 20 and are adapted to receive the threaded studs 42 and 44 of thermoelectric elements 18 and 20, respectively. Nuts 56 and 58 are received on the threaded end portions of the studs 42 and 44, respectively.

In the embodiment shown, a coil spring 60 is slipped around the cables 38 and 40 of thermoelectric elements 18 and 20, respectively. It should be understood, however, that other types of springs may be used intermediate the thermoelectric semiconductor bodies 30 and 32 and the thermal radiators 12′. For example, the cables 38 and 40 may themselves be compression spring devices. Other types of compression springs may be employed if desired. Springs may also be inserted on the interior of the braided cable 38 and 40. Springs 60, shown, are maintained in compression between the thermoelectric element of semiconductor body 30 and 32 and the thermal radiators 12′. Any spring means employed is preferably mounted in compression in the assembled device.

In the embodiment illustrated, the thermal radiators 12 and 12′ are of good heat conducting and electrical conducting material. Thus, as shown, a series circuit is established from an end radiator 13 of the cold junction through the first thermoelectric element 18, through the thermal radiator 12 and thermoelectric element 20, through the next adjacent thermal radiator 12′, and then through a thermal element 18 and again through a next adjacent thermal radiator 12, etc. This series circuit is continued with the circuit alternately passing through thermoelectric elements 18 and 20, consecutively. Although the thermoelectric elements are shown and described in this disclosure as being connected in series and being, alternately of p- and n-type semiconductor material, it should be understood, of course, that groups of parallel connected thermoelectric elements may be formed on a single module or certain of the modules may be connected in parallel groups. This may be done if increased current at a lower voltage is desired. It should also be understood that groups of parallel connected thermoelectric elements may be connected in series to provide a series-parallel arrangement.

In the embodiment shown a pair of leads 62 and 64 are secured to the cold junction, one at each end of the thermoelectric assembly. If it is desired to employ the thermoelectric device as a generator, these leads may serve as output leads. If it is desired to use the thermoelectric device in accordance with the Peltier effect for thermoelectric heating and cooling, leads 62 and 64 may be employed as input leads to which a source of voltage may be supplied.

In operation, if the thermoelectric device described herein is to be employed as a generator, heating means are utilized to provide heat for the heat source 14. Thus, the alternate p and n junctions secured to the thermal radiators 12 become hot junctions. Since the thermal radiators 12' are insulated from the heat source, the thermoelectric elements 18 and 20 secured to the thermal radiators 12' become a series of cold junctions. The cooling of the heat sink 16 may be effected by exposure to the ambient air or a separate cooling means may be utilized to cool the thermal radiators 12'. Thus, in accordance with the Seebeck effect, a current flows through the elements and through the leads 62 and 64 to a load, connected to leads 62 and 64. If the thermoelectric device illustrated is to be utilized as a refrigerator or heating device, a source of voltage is supplied to the thermoelectric elements through the leads 62 and 64. This electro-motive force will cause one of the thermal radiators 14 or 16 to drop in temperature while the other of the radiators becomes heated. This is in accordance with the Peltier effect.

Although the thermoelectric elements shown and described herein are of p and n type semiconductor material, it will be understood that any one of a number of dissimilar metals may be employed to form the thermoelectric junctions. For example, iron and consantan junctions or copper and iron junctions may be employed. Dissimilar semiconductor materials are utilized because it has been found that a greater degree of efficiency can be obtained by the use of selected semiconductor materials. In fact, the efficiency is so greatly improved that a thermoelectric device employing semiconductor materials can be used for high power applications whereas the devices employing dissimilar metals have in the past only been used for pyrometers and other temperature measuring devices.

It should now be apparent that a thermoelectric device has been provided which is efficient and reliable. The thermoelectric assembly described herein permits greater flexibility in generator design. It is of modular construction so that as many modules may be combined as necessary to provide the desired voltage or current. The need for close tolerances in the machining of the thermal elements is eliminated and the assembly is designed to permit structural and component expansion without affecting generator efficiency or reliability. The thermoelectric efficiency can be more easily optimized because the length of the two thermoelectric elements of a junction in a generator no longer have to be nearly equal. In order to obtain maximum efficiency, it is necessary that the thermal elements be matched electrically. Thus, it is sometimes required that the p element be of one physical size and the n element of another physical size in order to obtain optimum efficiency and matched electrical characteristics. This unique construction permits the generator to expand and contract while maintaining generator efficiency and at the same time minimize tensile and shear stresses across thermoelectric bodies 30 and 32. The generator is rugged and resistant to mechanical shock. The thermoelectric device of the present invention insures excellent thermal contact between the hot junction and the thermoelectric element since the thermoelectric element can be bonded directly thereto and still maintain the flexibility required. It will be apparent that various modifications may be made within the scope of the invention. Variations in the design of the heat exchanger may be possible or in the connections between the thermoelectric elements. The invention may be employed as either a generator, as shown, a refrigerator or a heating device.

It is to be understood therefore, that although a specific embodiment of the inventon has been shown and described for the purpose of illustration, the invention is not limited to the particular details of the structure shown, but in its broadest aspects, it includes all equivalent embodiments and modifications which come within the scope of the invention.

We claim as our invention:

1. A thermoelectric device comprising a pair of thermal radiator assemblies dispsed in spaced apart relation, a plurality of thermoelectric elements disposed between said radiator assemblies, each of said thermoelectric elements being bonded at one end to one of the radiator assemblies, a flexible conductor of good thermal and electrical conductivity secured to the other end of each thermoelectric element and to the other of said radiator assemblies, and compression spring means interposed between said other end of each of the thermoelectric elements and said other radiator assembly.

2. A thermoelectric device comprising a pair of thermal radiator assemblies disposed in spaced apart relation, a plurality of thermoelectric elements disposed between said radiator assemblies, each of said thermoelectric elements being bonded at one end to one of the radiator assemblies, a flexible conductor of good thermal and electrical conductivity secured to the other end of each thermoelectric element, means for attaching each of said conductors to the other of said radiator assemblies, spring means interposed between said other end of each of the thermoelectric elements and said other radiator assembly, and means for drawing the radiator assemblies toward each other to compress the spring means.

3. A thermoelectric device comprising a first group of substantially identical thermal radiators, a second group of substantially identical thermal radiators, at least two thermoelectric elements bonded to each of the radiators of the first group, a flexible conductor secured to each of the thermoelectric elements and to a radiator of the second group, means for securing the two groups of radiators in spaced relation, and compression spring means interposed between each of the thermoelectric elements and the adjacent radiator of the second group.

4. A thermoelectric device comprising a first group of substantially identical thermal radiators, a second group of substantially identical thermal radiators, each of the radiators of the first group having two dissimilar thermoelectric elements bonded thereto, a flexible conductor secured to each of the thermoelectric elements, the flexible conductors of the thermoelectric elements of each radiator of the first group being secured to different radiators of the second group, means for securing the two groups of radiators in spaced relation, and compression spring means interposed between each of the thermoelectric elements and the adjacent radiator of the second group.

5. A thermoelectric device comprising a first group of substantially identical thermal radiators, a second group of substantially identical thermal radiators, each of the radiators of the first group having two dissimilar thermo electric elements bonded thereto, a flexible conductor secured to each of the thermoelectric elements, the radiators of each group being electrically insulated from each other and disposed in side by side relation, means for securing the two groups of radiators in spaced relation with the radiators of one group laterally offset from the radiators of the other group, means for securing the flexible conductors of the thermoelectric elements of each radiator of the first group to different radiators of the second group, and compression spring means interposed between each thermoelectric element and the adjacent radiator of the second group.

References Cited in the file of this patent

UNITED STATES PATENTS

| | | |
|---|---|---|
| 2,232,961 | Milnes | Feb. 25, 1941 |
| 2,705,746 | Strange | Apr. 5, 1955 |
| 2,872,788 | Lindenblad | Feb. 10, 1959 |
| 2,949,497 | Jarvis et al. | Aug. 16, 1960 |
| 2,997,514 | Roeder | Aug. 22, 1961 |

FOREIGN PATENTS

| | | |
|---|---|---|
| 191,712 | Great Britain | July 7, 1923 |